United States Patent [19]
Violette

[11] Patent Number: 5,817,580
[45] Date of Patent: Oct. 6, 1998

[54] METHOD OF ETCHING SILICON DIOXIDE

[75] Inventor: Michael P. Violette, Boise, Id.

[73] Assignee: Micron Technology, Inc., Boise, Id.

[21] Appl. No.: 598,490

[22] Filed: Feb. 8, 1996

[51] Int. Cl.$^6$ .................................................. H01L 21/306
[52] U.S. Cl. ......................... 438/756; 438/738; 438/704; 438/705; 438/305
[58] Field of Search .................................... 438/756, 738, 438/704, 705, 305

[56] References Cited

U.S. PATENT DOCUMENTS 5,557,141  9/1996  Harada et al. ........................... 257/631

*Primary Examiner*—John M. Ford
*Attorney, Agent, or Firm*—Workman, Nydegger & Seeley

[57] ABSTRACT

A layer of silicon dioxide is formed conformably over a substrate having a surface with non-planar topography. The layer of silicon dioxide is then implanted with a species that affects the etch rate of the silicon dioxide when etched in an HF based etchant. The implant energy, dose, and direction are chosen such that only a selected portion of the layer of silicon dioxide is implanted with the implant species. The layer of silicon dioxide is then etched in an HF based etchant. The HF etchant etches both doped and undoped silicon dioxide, but the implanted silicon dioxide is removed at a faster rate or slower rate, depending on the implant species, than the unimplanted silicon dioxide. This allows the formation of specialized silicon dioxide structures due to the selectivity of the etch as between the implanted and unimplanted portions of the layer of silicon dioxide, without any damage to silicon.

33 Claims, 4 Drawing Sheets

METHOD OF ETCHING SILICON DIOXIDE

BACKGROUND OF THE INVENTION

1. The Field of the Invention

The present invention relates to the manufacture of semiconductor devices. More particularly, the present invention is directed to a method for performing a selective hydrofluoric acid (HF) based etch which method is useful in the formation of spacers and other structures of silicon dioxide during the manufacture of semiconductor devices.

2. The Relevant Technology

In the continuing quest to reduce the minimum feature size in integrated circuits, anisotropic plasma etching has found wide application, including for example its use in forming trenches in a silicon substrate for device isolation and for cell capacitor structures in DRAM designs, for defining polysilicon gates, for etching contacts and vias, and for forming spacers. Ion bombardment is used to increase the reaction rate in the direction of the bombardment, and film forming agents are used to decrease or prevent reactions on non-bombarded surfaces, resulting in a highly directional etch.

One drawback of plasma etching is its limited selectivity relative to chemically selective etches. A wet etch, vapor etch, or anhydrous etch of silicon dioxide in HF, for example, can achieve nearly infinite selectivity to silicon. Plasma etches are currently limited to 15:1, 20:1, or at most 30:1 selectivity. Selectivity to silicon is particularly useful in the formation of spacers, during which a layer of silicon oxide is typically removed from a source/drain area of the substrate. The source/drain area is particularly sensitive to damage caused by ion bombardment. If the source/drain area is significantly etched, an adjacent gate may be damaged and reliable contacts to the source/drain area may be difficult to form. A method of forming spacers with an HF based chemically selective etch process would prevent any damage to the source/drain area and is thus highly desirable.

SUMMARY AND OBJECTS OF THE INVENTION

An object of the present invention is to provide a method for forming spacers using an HF based chemically selective etch.

Another object of the present invention is to provide a method of using a chemically selective HF based etch to form various silicon dioxide structures in the manufacture of a semiconductor device.

Yet another object of the present invention is to provide a method of forming spacers while preventing any damage to a silicon substrate.

In accordance with the present invention, a layer of silicon dioxide is deposited conformably over a surface of a substrate having a non-planar topography such as raised structures or trenches. The layer of silicon dioxide is then implanted with phosphorous, with the direction and energy of the implant being chosen so as to implant in selected areas of the layer of silicon dioxide and not to implant in non-selected areas. The implant may optionally include implants at varying energy levels to achieve a desired implant profile. Multiple implant directions may also be employed. An anneal step may be included to diffuse and activate the implanted material.

The layer of silicon dioxide is then etched in an HF based etchant. The etchant preferentially etches the selected areas of the layer of silicon dioxide, resulting in the preferential removal of the selected areas while the non-selected areas remain mostly unetched. The etchant does not attack silicon at all, resulting in an etch which is very safe and non-damaging for silicon structures. If the selected areas are the horizontally disposed portions of a layer of silicon dioxide deposited conformably over raised structures, the method may be used to form silicon dioxide spacers by removing the horizontally disposed portions of the layer.

Alternatively, a layer of silicon dioxide may be prepared as above but implanted with boron rather than phosphorous. The etchant is then selective to the selected regions, etching the non-selected regions preferentially. This technique may be used to form structures such as contacts and side contacts.

In either of the above alternatives, the etchant does not attack silicon, providing a method for forming silicon dioxide structures that protects silicon from damage.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered with reference to specific examples of the application thereof which are illustrated in the appended drawings. Understanding that these drawings depict only typical applications of the invention and are not therefore to be considered to be limiting of its scope, the invention will be described and explained with additional specificity and detail with reference to the accompanying drawings in which.

DETAILED DESCRIPTION OF THE PREFERRED EMBODIMENTS

The present invention provides methods for forming spacers and other structures of silicon dioxide by use of an etch step employing HF based etchants. The use of HF based etchants avoids damage to silicon during the etch step. Damage to silicon can be a problem in plasma etches typically used to form spacers.

A method according to the present invention begins with the step of providing a substrate having a surface with non-planar topography, such as a substrate with raised structures such as gate stacks formed thereon, or such as a substrate with trenches formed therein. The substrate may be a semiconductor substrate such as a silicon substrate or any substrate useful in the manufacture of a semiconductor device.

Next, a layer of silicon dioxide is formed conformably over the surface of the substrate. The layer of silicon dioxide may be deposited, such as by a TEOS deposition process, or grown.

Next, the layer of silicon dioxide is implanted with a species that affects the etch rate of the silicon dioxide when etched in an HF based etchant. Phosphorous may be used as the implant species, for example, to increase the etch rate. Boron may be used to decrease the etch rate.

The implant energy, dose, and direction are chosen such that only a selected portion of the layer of silicon dioxide is implanted with the implant species. This may be achieved, for example, by implanting the layer of silicon dioxide in a direction normal to the surface of the substrate at an energy level sufficient to penetrate at most only to the thickness of the horizontally disposed portions of the layer of silicon dioxide. This leaves vertically disposed portions of the silicon dioxide layer, i.e., the portions formed on vertical surfaces, unimplanted. Implanting only a selected portion of the silicon dioxide layer may also be achieved by implanting the layer of silicon dioxide in a direction that is at an acute angle to an axis that is normal to the surface of the substrate, such that, due to the nonplanar topography of the surface of the substrate, at least some lower portions of the layer of silicon dioxide are shielded by an upper portion of the layer of silicon dioxide from the incoming implanting ions, leaving at least some lower portions of the layer of silicon dioxide unimplanted.

Finally, the now implanted layer of silicon dioxide is etched in an HF based etchant, such as an HF dip, HF vapor, or anhydrous HF. The HF etchant etches both doped and undoped silicon dioxide, but phosphorous doped silicon dioxide is removed at a faster rate than undoped silicon dioxide, while boron doped silicon dioxide is removed at a slower rate than undoped silicon dioxide. This allows the formation of specialized silicon dioxide structures due to the selectivity of the etch as between the implanted and unimplanted portions of the layer of silicon dioxide. Particular applications of this method to the formation of specific structures are explained below with reference to FIGS. 1–10.

Figure 1:
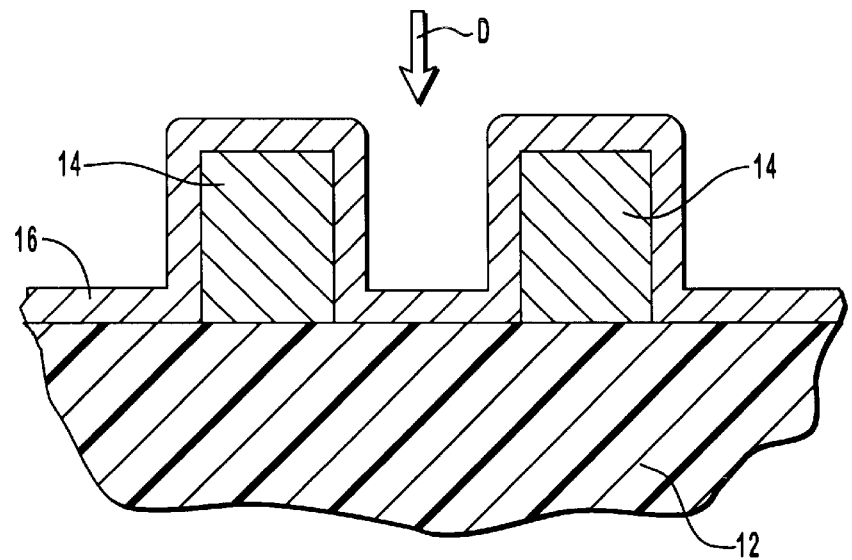
FIG. 1 is a partial cross section of a partially formed semiconductor device with a layer of silicon dioxide for use with the methods of the present invention.

FIG. 1 shows a silicon substrate having raised structures 14 such as gates stacks formed thereon. A layer of silicon dioxide 16 has been deposited conformably over substrate 12 and raised structures 14. Phosphorous is then implanted in direction D normal to the surface of substrate 12.

Figure 2:
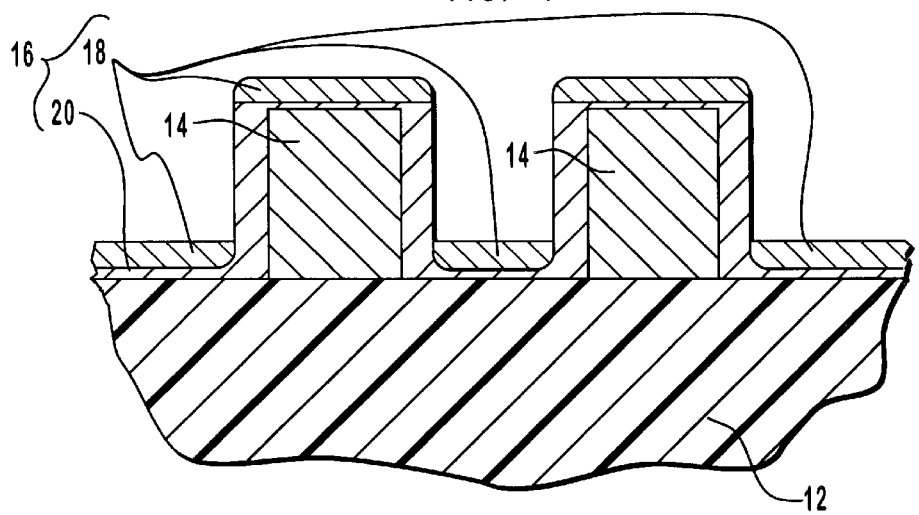
FIG. 2 is the cross section of FIG. 1 after an implant step according to the methods of the present invention.

FIG. 2 shows the results of the implant in direction D shown in FIG. 1. Layer of silicon dioxide 16 now includes a selected portion 18 which is phosphorous implanted and a non-selected portion 20 which has remained unimplanted. Multiple implants or an implant at multiple energies may be used to achieve a desired dopant profile. An anneal may optionally be performed also to optimize the dopant profile. Layer of silicon dioxide 16 is then etched in an HF based etchant.

Figure 3:
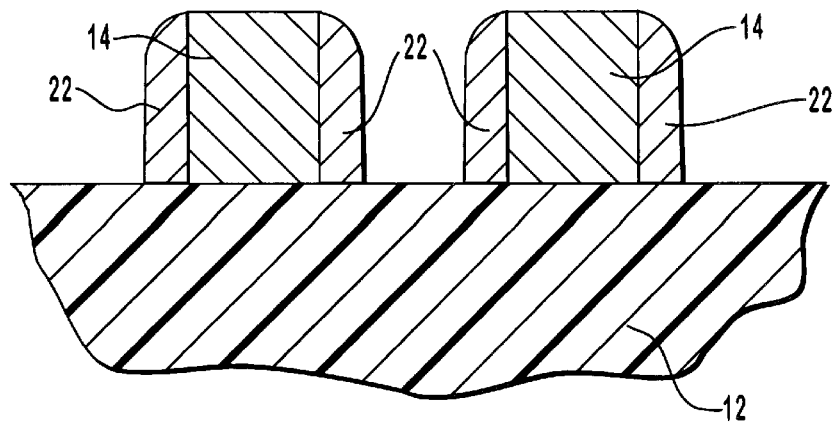
FIG. 3 is the cross section of FIG. 2 after an etch step according to the methods of the present invention.

FIG. 3 shows the results of etching in an HF based etchant. The selected portion of layer of silicon dioxide 16 is completely removed, along with a small portion of the non-selected portion, leaving only spacers 22. The method of the present invention thus provides for the formation of silicon dioxide spacers by an etch with an HF based etchant. The HF based etchant will not harm silicon substrate 12, unlike plasma etches typically used to form spacers.

Figure 4:
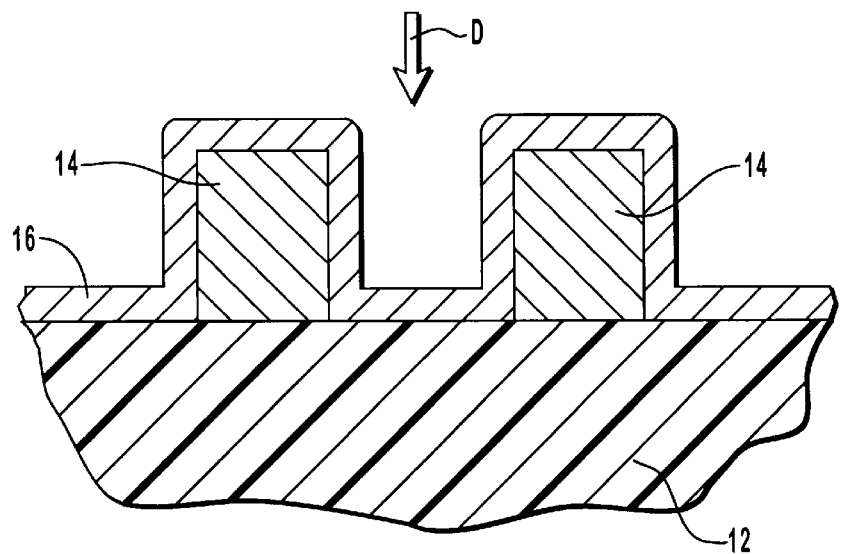
FIG. 4 is a partial cross section of a partially formed semiconductor device with a layer of silicon dioxide for use with the methods of the present invention.
Figure 5:
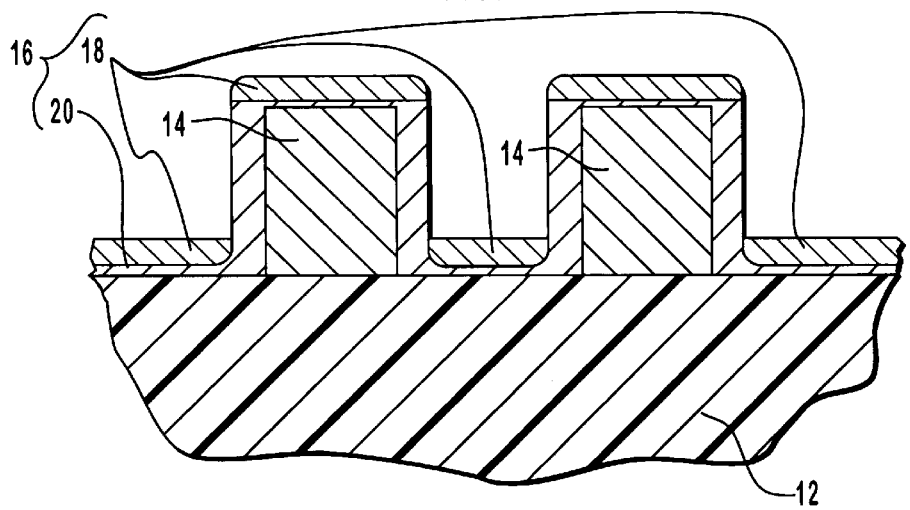
FIG. 5 is the cross section of FIG. 4 after an implant step according to the methods of the present invention.
Figure 6:
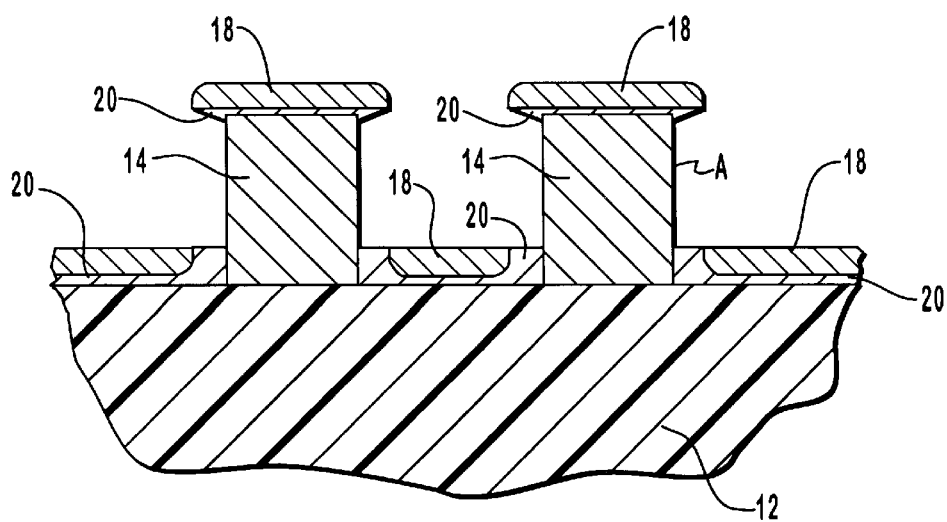
FIG. 6 is the cross section of FIG. 5 after an etch step according to the methods of the present invention.

FIGS. 4 through 6 illustrate the same process sequence as illustrated in FIGS. 1–3, with the same reference characters indicating identical structures, except that boron is employed as the implant species. Thus in FIG. 5, selected portion 18 of layer of silicon dioxide 16 is boron doped, rather than phosphorous doped.

FIG. 6 shows the results after the etch in an HF based etchant. Undoped non-selected portion 20 of layer of silicon dioxide 16 is preferentially etched relative to doped selected portion 18, resulting in a structure allowing for the formation of side contacts to raised structures 14 such as at area A.

Figure 7:
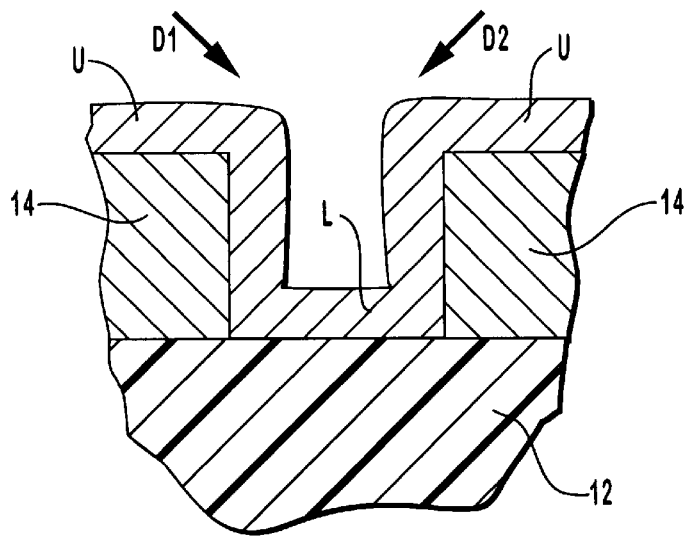
FIG. 7 is a partial cross section of a partially formed semiconductor device with a layer of silicon dioxide for use with the methods of the present invention.
Figure 8:
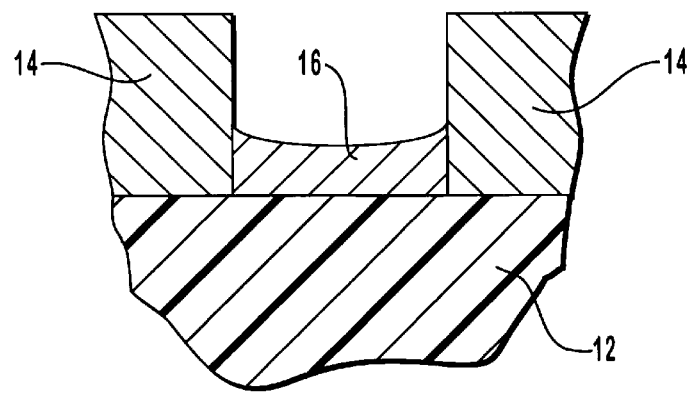
FIG. 8 is the cross section of FIG. 7 after processing according to a method of the present invention.
Figure 9:
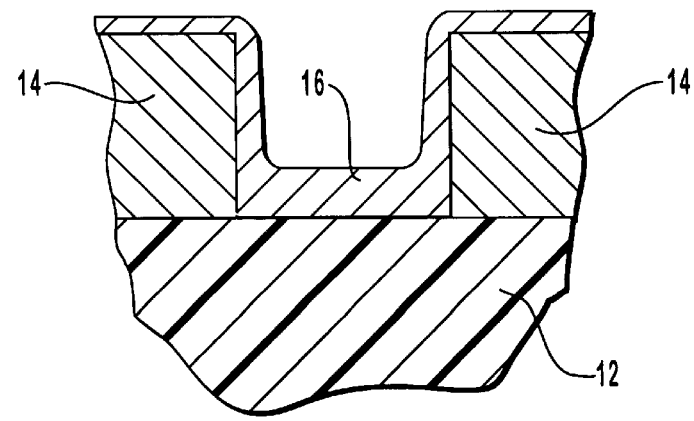
FIG. 9 is the cross section of FIG. 7 after processing according to another method of the present invention.

FIG. 7 shows a substrate 12 having raised structures 14 thereon, with a layer of silicon dioxide formed conformably over substrate 12 and raised structures 14. Layer of silicon dioxide 16 is then implanted along two different directions, D1 and D2. Directions D1 and D2 are selected to be at an acute angle to an axis that is normal to the surface of substrate 12 and to have components parallel to the surface of substrate 12 which are perpendicular to the major axis of the topography found on substrate 12, such as the trench between raised structures 14. The acute angle to the normal axis is chosen such that a lower portion L of layer of silicon dioxide 16 is shielded from the incoming implant ions by an upper portion U of layer of silicon dioxide 16. This results in only lower portion L of layer of silicon dioxide 16 remaining unimplanted, while upper portion U and vertically disposed portions of layer of silicon dioxide 16 are implanted.

Where phosphorous is used as the implant species, the HF based etch then results in the structure shown in FIG. 8, or in the structure shown in FIG. 9.

The structure of FIG. 8 may be achieved by implanting phosphorous fairly deep in layer of silicon dioxide 16 and by etching until all of layer of silicon dioxide 16 at the implanted areas has been removed. By repetition, this application of the methods of the present invention may be used to fill the trench between raised structures 14 to achieve a planar upper surface.

The structure of FIG. 9 may be achieved by implanting phosphorous less deep in layer of silicon dioxide 16 and by etching only until the profile shown in FIG. 9 is achieved. The profile of layer of silicon 16 shown in FIG. 9 is prograde, i.e., it slopes inward toward the top of raised structures 14. Such a profile is important for the elimination of stringers which can result when overhanging or retrograde profiles shield deposited material, making it difficult to remove. The methods of the present invention are thus useful in achieving prograde profiles to prevent stringers.

Figure 10:
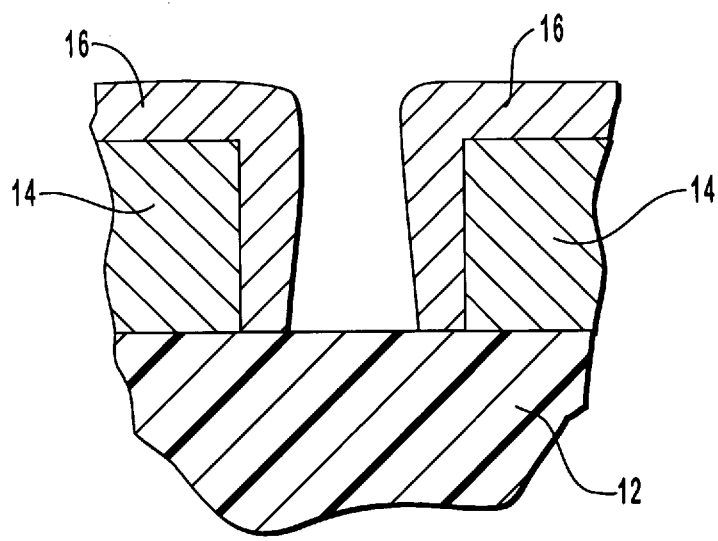
FIG. 10 is the cross section of FIG. 7 after processing according to yet another method of the present invention.

If boron is used as the dopant in the implant step described above in relation to FIG. 7, the resulting structure after etch is that of FIG. 10. Lower portion L of layer of silicon dioxide 16 seen in FIG. 7 has been preferentially removed as seen in FIG. 10. This application of the methods of the present invention allows the formation of a contact to substrate 12 with lowered risk of damaging substrate 12.

Other combinations of implant directions are of course possible. An implant similar to that discussed in relation to FIG. 7 may be performed with four implant directions, preferably with each direction at a given angle with respect to an axis that is normal to the surface of the substrate, but with the components of a first pair of the directions parallel to the surface of the substrate being opposite each other and perpendicular to a first major axis of the topography of the structures on the substrate, and the components of a second pair of the directions parallel to the surface of the substrate being opposite each other and perpendicular to a second major axis of the topography of the structures on the substrate. This allows the formation of the structures shown in FIGS. 8-10 in two orthogonal directions simultaneously.

Figure 11:
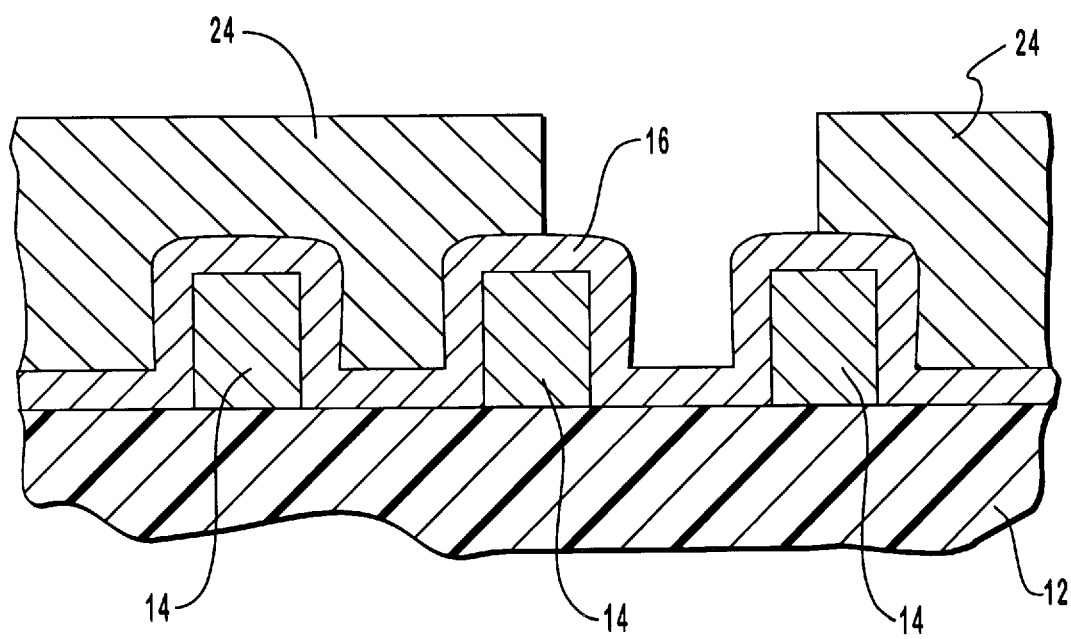
FIG. 11 is a partial cross section of a partially formed semiconductor device with a layer of silicon dioxide and a layer of masking material for use with the methods of the present invention.

FIG. 11 shows a substrate 12 with raised structures 14 thereon and a layer of silicon dioxide 16 formed conformably over substrate 12 and raised structures 14. A layer of masking material 24 such as photoresist has then been formed and patterned over layer of silicon dioxide 16. Layer of masking material 24 allows a subsequent implant of phosphorous or boron into layer of silicon dioxide 16 to be applied only at the areas exposed through layer of masking material 24.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of removing silicon dioxide comprising:
   providing a substrate having a surface thereon, said substrate being composed of a first material;
   forming a layer of silicon dioxide on said surface of said substrate;
   implanting a dopant into said layer of silicon dioxide to form doped and undoped portions of said layer of silicon dioxide; and
   etching said layer of silicon dioxide with an etchant that has a faster material removal rate from said doped portion of said layer of silicon dioxide than the material removal rates from either said undoped portion of said layer of silicon dioxide or said first material of said substrate.

2. A method of removing silicon dioxide comprising:
   providing a substrate having a surface thereon, said substrate being composed of silicon;
   forming a layer of silicon dioxide on said surface, said layer of silicon dioxide having a first portion and a second portion;
   doping said layer of silicon dioxide by implanting phosphorous therein to form a doped portion of said layer of silicon dioxide that is doped with phosphorous and an undoped portion of said layer of silicon dioxide that is not doped with phosphorous; and
   etching said layer of silicon dioxide with an etchant that removes the doped portion of the layer of silicon dioxide at a faster rate than either silicon or undoped portion of the layer of silicon dioxide is removed.

3. A method of removing silicon dioxide comprising:
   providing a substrate having a surface thereon, said substrate being composed of a first material;
   forming a layer of silicon dioxide on said surface, said layer of silicon dioxide having a first portion and a second portion;
   implanting an implant species into said first portion without implanting said implant species into said second portion; and
   etching said layer of silicon dioxide with an etchant that is:
   selective to second portion;
   selective to said first material of said substrate; and
   not selective to said first portion.

4. The method as defined in claim 3, wherein the etchant is HF.

5. The method as defined in claim 3, wherein the implant species is phosphorous.

6. The method as defined in claim 3, wherein the first material of the substrate is silicon.

7. The method as defined in claim 3, wherein the surface has a non-planar topography.

8. The method as defined in claim 3, wherein the implanted species is implanted with:
   an implant direction with respect to the surface of the substrate; and
   an implant energy.

9. The method as defined in claim 3, wherein the implanted species is implanted with an implant direction that is normal to the surface of said substrate.

10. The method as defined in claim 3, wherein the implanted species is implanted with:
    a plurality of implant directions with respect to the surface of the substrate; and
    a plurality of implant energies.

11. The method as defined in claim 3, wherein etching said layer of silicon dioxide with an etchant comprises the step of dipping the substrate into a liquid HF.

12. The method as defined in claim 3, wherein etching said layer of silicon dioxide with an etchant comprises the step of exposing said layer of silicon dioxide to an HF vapor.

13. The method as defined in claim 3, wherein etching said layer of silicon dioxide with an etchant comprises the step of exposing said layer of silicon dioxide to anhydrous HF.

14. A method of removing silicon dioxide comprising:
    providing a substrate having a surface thereon, said substrate being composed of a semiconductor material;
    forming a layer of silicon dioxide on said surface, said layer of silicon dioxide having a first portion and a second portion;
    forming a layer of a masking material upon the layer of silicon dioxide, said layer of said masking material having:
    a first portion upon and the first portion of the layer of silicon dioxide; and
    a second portion upon and the second portion of the layer of silicon dioxide;
    patterning said layer of said masking material to:
    remove the first portion of said layer of said masking material;
    expose the first portion of the silicon dioxide; and
    leave the second portion of the layer of the masking material upon the second portion of the layer of silicon dioxide;
    implanting an implant species into said first portion of said layer of silicon dioxide without implanting said implant species into said second portion of said layer of silicon dioxide; and
    etching said layer of silicon dioxide with an etchant that is:
    selective to second portion of said layer of silicon dioxide;
    selective to said semiconductor material of said substrate; and
    not selective to said first portion of said layer of silicon dioxide.

15. The method as defined in claim 14, wherein said masking material is a photoresist material.

16. A method of removing silicon dioxide comprising:

providing a substrate having a surface thereon, said substrate being composed of silicon, and said surface having a non-planar topography;

forming a layer of silicon dioxide on said surface, said layer of silicon dioxide having a first portion and a second portion;

implanting phosphorous into said first portion without implanting phosphorous into said second portion; and etching said layer of silicon dioxide with an etchant that is:
  selective to second portion;
  selective to said silicon of said substrate; and
  not selective to said first portion.

17. A method of removing silicon dioxide comprising:

providing a substrate having a surface thereon, said substrate being composed of silicon, and said surface having a non-planar topography;

forming a layer of silicon dioxide on said surface, said layer of silicon dioxide having a first portion and a second portion;

implanting phosphorous into said first portion without implanting phosphorous into said second portion;

annealing said substrate to diffuse said implanted phosphorous; and etching said layer of silicon dioxide with HF.

18. A method of removing silicon dioxide comprising:

providing a substrate having a surface thereon, said substrate being composed of a first material;

forming a layer of silicon dioxide on said surface, said layer of silicon dioxide having a first portion and a second portion;

implanting a dopant into said first portion without implanting said dopant into said second portion; and etching said layer of silicon dioxide with an etchant that has a faster material removal rate from said second portion than the material removal rates from either said first portion or said first material of said substrate.

19. A method of removing silicon dioxide comprising:

providing a substrate having a surface thereon, said substrate being composed of silicon;

forming a layer of silicon dioxide on said surface, said layer of silicon dioxide having a first portion and a second portion;

doping said layer of silicon dioxide by implanting boron therein to form a doped portion of said layer of silicon dioxide that is doped with boron and an undoped portion of said layer of silicon dioxide that is not doped with boron; and etching said layer of silicon dioxide with an etchant that removes the doped portion of the layer of silicon dioxide at a slower rate than either silicon or the undoped portion of the layer of silicon dioxide is removed.

20. A method of removing silicon dioxide comprising:

providing a substrate having a surface thereon, said substrate being composed of a first material, and said surface having a non-planar topography;

forming a layer of silicon dioxide on said surface, said layer of silicon dioxide having a first portion and a second portion;

implanting an implant species into said first portion without implanting said implant species into said second portion; and etching said layer of silicon dioxide with an etchant that is:
  selective to first portion;
  selective to said first material of said substrate; and
  not selective to said second portion.

21. The method as defined in claim 20, wherein the etchant is HF.

22. The method as defined in claim 20, wherein the implant species is boron.

23. The method as defined in claim 20, wherein the first material of the substrate is silicon.

24. The method as defined in claim 20, wherein the surface has a non-planar topography.

25. The method as defined in claim 20, wherein the implanted species is implanted with:
  an implant direction with respect to the surface of the substrate; and
  an implant energy.

26. The method as defined in claim 20, wherein the implanted species is implanted with an implant direction that is normal to the surface of said substrate.

27. The method as defined in claim 20, wherein the implanted species is implanted with:
  a plurality of implant directions with respect to the surface of the substrate; and
  a plurality of implant energies.

28. A method of removing silicon dioxide comprising:

providing a substrate having a surface thereon, said substrate being composed of silicon, and said surface having a non-planar topography;

forming a layer of silicon dioxide on said surface, said layer of silicon dioxide having a first portion and a second portion;

implanting boron into said first portion without implanting boron into said second portion; and etching said layer of silicon dioxide with an etchant that is:
  selective to first portion;
  selective to said silicon of said substrate; and
  not selective to said second portion.

29. A method of removing silicon dioxide comprising:

providing a substrate having a surface thereon, said substrate being composed of silicon, and said surface having a non-planar topography;

forming a layer of silicon dioxide on said surface, said layer of silicon dioxide having a first portion and a second portion;

implanting boron into said first portion without implanting boron into said second portion;

annealing said substrate to diffuse said implanted boron; and etching said layer of silicon dioxide with HF.

30. A method of forming a semiconductor structure, the method comprising:

providing a substrate composed of a semiconductor material, the substrate having a surface thereon that is planar;

forming a gate stack upon a surface of the surface of the substrate, said gate stack having:
  a top surface;
  a first side surface; and
  a second side surface that is opposite of the first side surface;

forming a layer of silicon dioxide upon the gate stack and upon the surface of the substrate, said layer of silicon dioxide having:

a top portion upon the top surface of the gate stack;
a first side portion upon the first side surface of the gate stack;
a second side portion upon the second side surface of the gate stack; and
a third portion that is upon the surface of the substrate;
implanting a dopant into said layer of silicon dioxide at an implant direction that is normal to the surface of said substrate such said dopant is implanted into:
the top portion upon the top surface of the gate stack; and
the third portion that is upon the surface of the substrate;
wherein said dopant is not implanted into:
the first side portion upon the first side surface of the gate stack; and
the second side portion upon the second side surface of the gate stack;
etching said layer of silicon dioxide with an etchant that has a faster material removal rate from the top and third portions of said layer of silicon dioxide than the material removal rates from either said first and second side portions of said layer of silicon dioxide or from said semiconductor material of said substrate.

31. A method of forming a semiconductor structure comprising:
providing a substrate composed of silicon, the substrate having a surface thereon that is planar;
forming a gate stack upon a surface of the surface of the substrate, said gate stack having:
a top surface;
a first side surface; and
a second side surface that is opposite of the first side surface;
forming a layer of silicon dioxide upon the gate stack and upon the surface of the substrate, said layer of silicon dioxide having:
a top portion upon the top surface of the gate stack;
a first side portion upon the first side surface of the gate stack;
a second side portion upon the second side surface of the gate stack; and
a third portion that is upon the surface of the substrate;
implanting a phosphorous dopant into said layer of silicon dioxide at an implant direction that is normal to the surface of said substrate such said phosphorous dopant is implanted into:
the top portion upon the top surface of the gate stack; and
the third portion that is upon the surface of the substrate;
wherein said dopant is not implanted into:
the first side portion upon the first side surface of the gate stack; and
the second side portion upon the second side surface of the gate stack;
etching said layer of silicon dioxide with HF, whereby said surface of said substrate is exposed that adjacent to the first and second side portions of the layer of silicon dioxide.

32. A method of forming a semiconductor structure comprising:
providing a substrate composed of a semiconductor material, the substrate having a surface thereon that is planar;
forming a gate stack upon a surface of the surface of the substrate, said gate stack having:
a top surface;
a first side surface; and
a second side surface that is opposite of the first side surface;
forming a layer of silicon dioxide upon the gate stack and upon the surface of the substrate, said layer of silicon dioxide having:
a top portion upon the top surface of the gate stack;
a first side portion upon the first side surface of the gate stack;
a second side portion upon the second side surface of the gate stack; and
a third portion that is upon the surface of the substrate;
implanting a dopant into said layer of silicon dioxide at an implant direction that is normal to the surface of said substrate such said dopant is implanted into:
the top portion upon the top surface of the gate stack; and
the third portion that is upon the surface of the substrate;
wherein said dopant is not implanted into:
the first side portion upon the first side surface of the gate stack; and
the second side portion upon the second side surface of the gate stack;
etching said layer of silicon dioxide with an etchant that has a slower material removal rate from the top and third portions of said layer of silicon dioxide than the material removal rates from either said first and second side portions of said layer of silicon dioxide or from said semiconductor material of said substrate.

33. A method of forming a semiconductor structure comprising:
providing a substrate composed of silicon, the substrate having a surface thereon that is planar;
forming a gate stack upon a surface of the surface of the substrate, said gate stack having:
a top surface;
a first side surface; and
a second side surface that is opposite of the first side surface;
forming a layer of silicon dioxide upon the gate stack and upon the surface of the substrate, said layer of silicon dioxide having:
a top portion upon the top surface of the gate stack;
a first side portion upon the first side surface of the gate stack;
a second side portion upon the second side surface of the gate stack; and
a third portion that is upon the surface of the substrate;
implanting a boron dopant into said layer of silicon dioxide at an implant direction that is normal to the surface of said substrate such said boron dopant is implanted into:
the top portion; and
the third portion;
wherein said dopant is not implanted into:
the first side portion; or
the second side portion;
etching said layer of silicon dioxide with HF, whereby said first side surface of said gate stack and said second side surface of said gate stack are exposed.

* * * * *